(12) United States Patent
Goodwin

(10) Patent No.: US 6,545,879 B1
(45) Date of Patent: Apr. 8, 2003

(54) METHOD AND APPARATUS FOR MOUNTING A LIDLESS SEMICONDUCTOR DEVICE

(75) Inventor: Jonathan W. Goodwin, Braintree, MA (US)

(73) Assignee: Tyco Electronics Corporation, Middletown, PA (US)

( * ) Notice: Subject to any disclaimer, the term of this patent is extended or adjusted under 35 U.S.C. 154(b) by 0 days.

(21) Appl. No.: 10/044,596

(22) Filed: Jan. 10, 2002

(51) Int. Cl.⁷ .............................. H05K 7/02; H05K 7/04
(52) U.S. Cl. .................... 361/807; 361/704; 361/709; 361/714; 361/715; 361/688; 361/735; 361/790; 361/785; 361/787
(58) Field of Search ................................ 361/704, 702, 361/707, 709, 710, 711, 697, 735, 790, 785, 768, 769, 787, 807, 803, 688, 714, 715; 257/718, 719, 717

(56) References Cited

U.S. PATENT DOCUMENTS

| | | | |
|---|---|---|---|
| 5,384,940 A | | 1/1995 | Soule et al. .................. 24/453 |
| 5,880,930 A | * | 3/1999 | Wheaton .................... 165/80.3 |
| 6,137,298 A | * | 10/2000 | Binns .......................... 324/755 |
| 6,390,475 B1 | * | 5/2002 | Eckblad et al. ............. 165/80.3 |
| 6,400,577 B1 | * | 6/2002 | Goodwin et al. ...... 174/35 GC |

* cited by examiner

Primary Examiner—David Martin
Assistant Examiner—Thanh Y. Tran

(57) ABSTRACT

A method and apparatus for mounting a lidless semiconductor device. A lidless semiconductor device, such as a land grid array device comprising a substrate having a semiconductor die mounted thereon is disposed in a socket. The socket includes a plurality of resilient conductive members arranged in a predetermined contact array pattern for conductively coupling conductive contacts on a printed circuit board with corresponding contacts on the underside of the lidless semiconductor device. A first set of springs applies a predetermined force to the substrate to conductively couple the contacts on the substrate to the contacts on the printed circuit board via the conductive members of the socket. Another set of springs urges the bottom surface of a heat sink into thermally conductive abutting relation with the top surface of the semiconductor die. The pressure on the die is less than the pressure applied by the substrate so as to avoid damage to the semiconductor die.

9 Claims, 4 Drawing Sheets

METHOD AND APPARATUS FOR MOUNTING A LIDLESS SEMICONDUCTOR DEVICE

CROSS REFERENCE TO RELATED APPLICATIONS

N/A

STATEMENT REGARDING FEDERALLY SPONSORED RESEARCH OR DEVELOPMENT

N/A

BACKGROUND OF THE INVENTION

The present invention relates to mounting techniques for semiconductor devices and more specifically to a method and system for mounting a lidless semiconductor device.

Semiconductor devices are often mounted to a printed circuit board via a semiconductor device socket. By mounting a semiconductor device in this manner, the device may be readily removed and replaced in the event of a device failure.

Semiconductor device packages take a number of forms. In a lidded semiconductor device, a semiconductor die is mounted to a substrate. A heat spreader plate having a cavity on the underside of the plate that is sized to receive the die is mounted to the substrate with the die positioned within the cavity. Thermal epoxy is underfilled in the cavity surrounding in the area surrounding the die. This structure provides mechanical rigidity for the semiconductor device and allows for heat removal from the die. More specifically, heat removal from the semiconductor die may be accomplished by abutting a heat sink to the top surface of the heat spreader plate. Heat is conveyed from the die to the thermal epoxy and from the thermal epoxy to the heat spreader plate and the abutting heat sink. To obtain efficient heat removal, the heat sink must sufficient force to the top surface of the lidded device to achieve good thermal conductivity.

The above-described technique achieves less than optimal heat removal since thermal epoxy is not an ideal conductor of heat. The failure to adequately remove heat from a semiconductor device can result in the failure of the device.

Recognizing that thermal epoxy impedes heat removal from the semiconductor die, in some systems, lidless semiconductor devices are employed. More specifically, lidless semiconductor devices that have a ball grid array have been soldered directly to a circuit board. A heat sink has been mounted above such devices and pressure has been applied to the heat sink to urge the heat sink against the top surface of the die so as to provide an effective thermally conductive interface between the top surface of the die and the heat sink.

While it is desirable to employ sockets for the mounting of semiconductor devices, the mounting of a lidless semiconductor device such as a land grid array (LGA) device is problematic. A minimum pressure is required to assure proper electrical conductivity between the contacts on the underside of an LGA device and associated conductive contacts in the socket. Considerably less pressure is required to provide proper thermal conductivity between a heat sink and the top surface of a lidless device. The application of forces to the top surface of the lidless device that are sufficient to obtain good electrical conductivity between the semiconductor device contacts and the socket contacts may result in damage to the semiconductor die.

Accordingly it would be desirable to be able to mount a lidless semiconductor device within a socket, such as an LGA socket in a manner that provides the forces needed to assure proper electrical conductivity at the respective interfaces while not subjecting the semi-conductor die to potntial damage as a consequence of expressive forces imported by a heat sink.

BRIEF SUMMARY OF THE INVENTION

A method and apparatus for mounting a lidless semiconductor device is disclosed. A lidless semiconductor device, such as a land grid array device, comprising a substrate having a semiconductor die mounted thereon is disposed in a socket. The socket includes a plurality of conductive members arranged in a predetermined contact array pattern for conductively coupling conductive contacts on a printed circuit board with corresponding contacts on the underside of the lidless semiconductor device. A first set of springs applies pressure to the semiconductor substrate via a pressure plate so as to compress the conductive members of the socket between the printed circuit board and the lower surface of the lidless semiconductor device and conductively couple the contacts of the lidless semiconductor device to corresponding contacts on the printed circuit board. A heat sink is mounted above the socketed lidless semiconductor device and a second set of springs urges a pedestal integral with the bottom surface of a heat sink into abutting relation with the top surface of the semiconductor die. The pressure on the die generated by the second set of springs is sufficiently low to avoid damage to the semiconductor die.

Other features, aspects and advantages of the presently disclosed invention will be apparent from the Detailed Description of the Invention that follows.

BRIEF DESCRIPTION OF THE SEVERAL VIEWS OF THE DRAWING

The invention will be more fully understood by reference to the following Detailed Description of the Invention in Conjunction with the Drawing, of which.

DETAILED DESCRIPTION OF THE INVENTION

In accordance with the present invention method and apparatus for mounting a lidless semiconductor device, such as a lidless Land Grid Array (LGA) device, within a cooperative socket is disclosed. The lidless semiconductor device includes a substrate and a semiconductor die mounted thereto as is known in the art. A set of first springs compresses conductive contact members of a socket into conductive relation with corresponding contacts on the underside of the lidless semiconductor device and contacts disposed on a printed circuit board. The first springs are selected to provide a compressive force that assures proper electrical conductivity between the respective contacts on the semiconductor device and the printed circuit board. A set of second springs urges a contact surface of a heat sink against the top surface of the semiconductor die to generate good thermal conductivity between the heat sink and the semiconductor die. The pressure applied by the heat sink to the semiconductor die is sufficiently low to avoid damage to the semiconductor die while being adequate to provide good thermal conductivity between the die and the heat sink.

Figure 1:
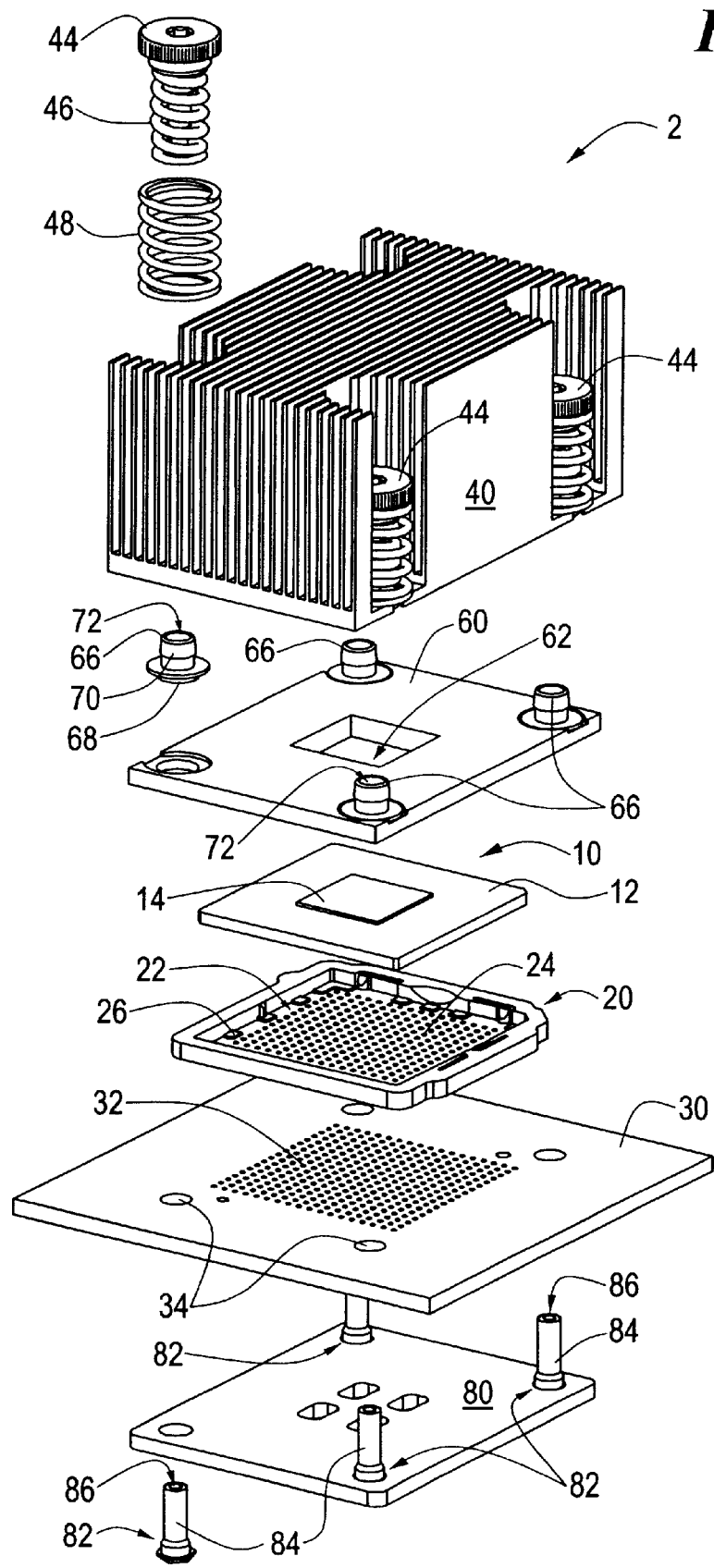
FIG. 1 is an top exploded perspective view of an assembly for mounting a lidless semiconductor device in accordance with the present invention.
Figure 2:
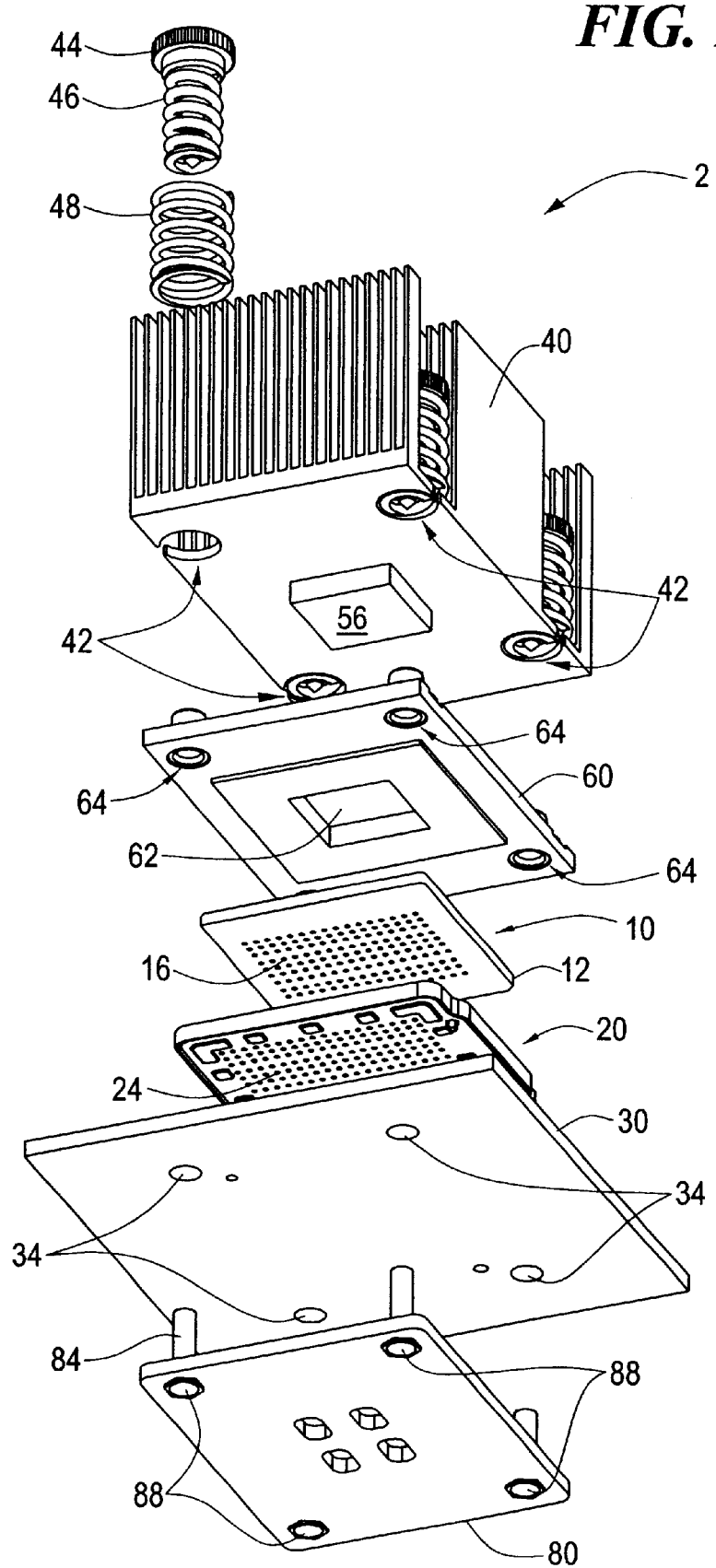
FIG. 2 is bottom exploded perspective view of the assembly of FIG. 1.

More specifically, referring to FIGS. 1 and 2, a mounting assembly 2 for mounting a lidless semiconductor device 10 is shown. The lidless semiconductor device 10 includes a substrate 12 and a semiconductor die 14 electrically and mechanically coupled to the substrate 12 as known in the art. The substrate 12 includes conductive contacts 16 arranged in a predetermined grid array on the underside of the substrate 12 (See FIG. 2). A semiconductor socket 20 includes a cavity 22 that is sized to receive the lidless semiconductor device 10. The socket 20 includes a plurality of conductive members 24 that are mounted within a carrier 26. The socket 20 is mountable to a printed circuit board 30. The printed circuit board 30 includes a plurality of conductive contacts 32 that are arranged in the predetermined grid array pattern corresponding to the contact pattern on the underside of the substrate 12 of the lidless semiconductor device 10. The conductive members 24 are intended to conductively couple the conductive contacts 32 on the printed circuit board 30 with the conductive contacts 16 on the underside of the substrate 12 when the socket 20 is mounted to the printed circuit board 30 and the lidless semiconductor device 10 is mounted within the socket 20 in assembled relation.

The mounting assembly 2 further includes a heat sink 40 that has openings 42 in respective corners. The assembly 2 also includes cap screws 44, a set of first springs 46 of a first diameter, a set of second springs 48 of a second larger diameter. The cap screws 44 include a first shoulder portion 50 serving as a first spring restraint, a second shoulder portion 52 serving as a second spring restraint, and a threaded screw portion 54 (See FIG. 4). The outside diameter of the first springs 46 is less than the inside diameter of the second springs 48 so that the first springs 46 may be inserted within the second springs 48 as subsequently described. Additionally, the assembly 2 includes a pressure plate 60 having a generally rectangular central opening 62 and through-holes 64 in corners of the plate 60 sized to receive bushings 66. Finally, the assembly 2 includes a bolster plate 80 that has through-holes 82 in corners of the bolster plate 80 that are sized to receive standoffs 84. The standoffs 84 include a threaded bore 86 at the upper end of the standoffs 80 that is sized to receive the threaded screw portion 54 of the cap screws 44. A head 88 is provided at the lower end of the standoffs 84. The standoffs 84 include an reduced diameter portion 90 just above the head 88 that provides an interference fit with the through-holes 82 in the bolster plate 80 when the standoffs 84 are mounted within the bolster plate 80 as shown. More specifically, the standoffs 80 are inserted through the through-holes 82 from the underside of the bolster plate 80 and urged into the mounting position in which the standoffs 84 are maintained within the bolster plate 80 by reason of the interference fit between the reduced diameter portion 90 of the standoffs 84 and the side surfaces of the through-holes 82 within the bolster plate 80. The function of the various components is subsequently described with more particularity below.

The bushings 66 have a lower end portion 68 (See FIG. 4) of a diameter sized for an interference fit with through-holes 64 in the pressure plate 60. Additionally, the bushings 66 have a through-bore 72 extending through the bushings 66. The bore 72 within the bushings 66 has a diameter that is sized to permit the standoffs 84 to pass through the bushings 66 when the components are disposed in assembled relation.

Figure 3:
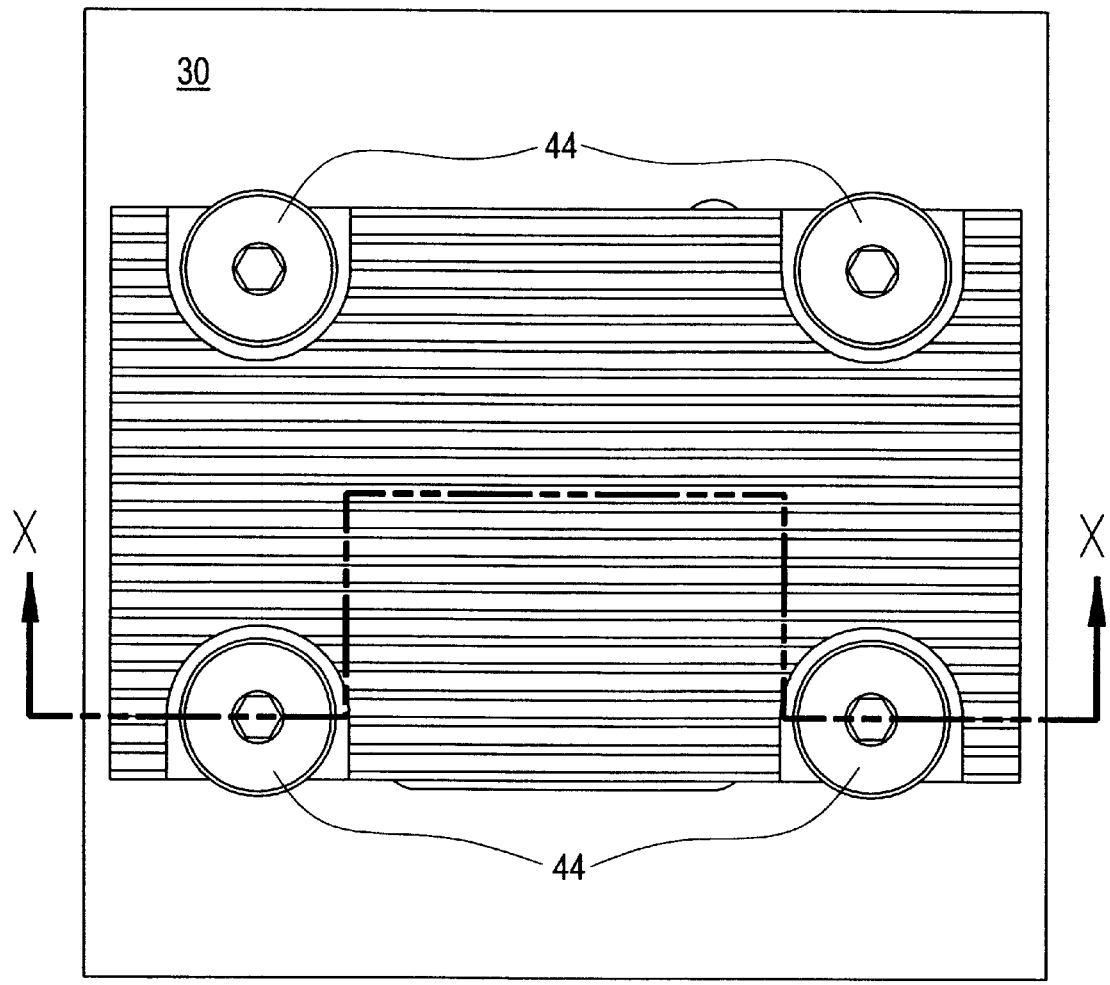
FIG. 3 is a top plan view of the assembly of FIG. 1.
Figure 4:
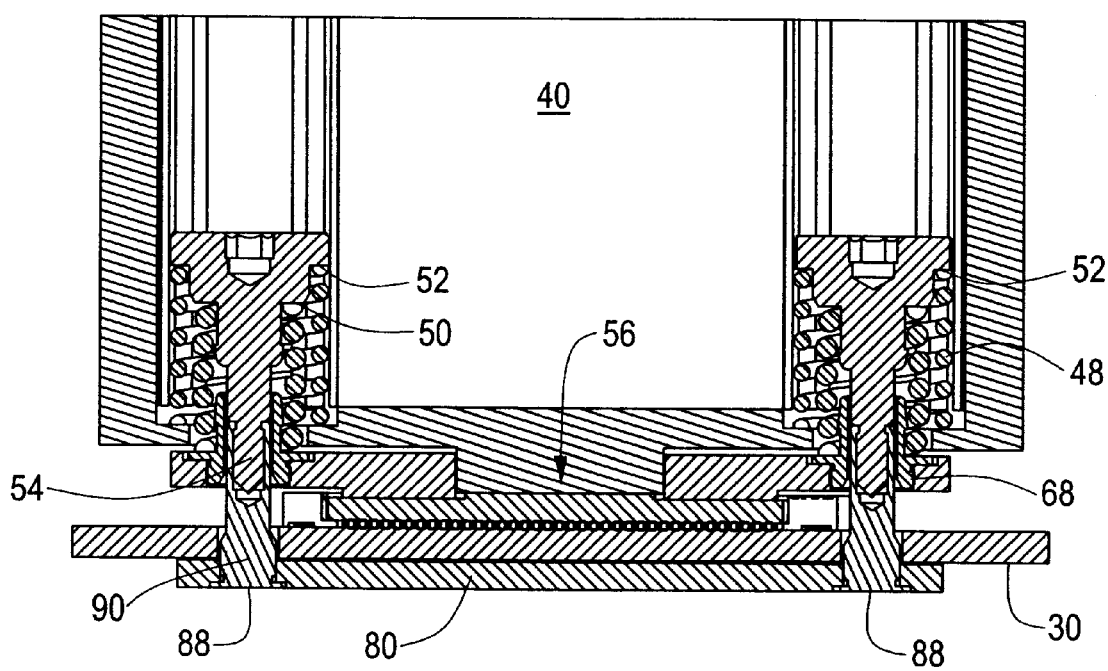
FIG. 4 is a side cross-sectional view of the assembly of FIG. 1 along the section XX shown in FIG. 3.

The operation and functions of the various components within the mounting assembly 2 are described generally below with respect to FIGS. 1–4. FIG. 3 shows a top plan view of the mounting assembly 2. FIG. 4 is a side cross-sectional view of the mounting assembly 2 through the plane XX shown in FIG. 3.

More specifically, the standoffs 84 are mounted within the respective through-holes 82 of the bolster plate 80 as described above and the standoffs 84 are inserted through the corresponding openings 34 within the printed circuit board 30. The socket 20 is disposed in a mounting location on the printed circuit board 30 such that the conductive members 24 of the socket 20 contact corresponding contacts 32 on the printed circuit board 30. The lidless semiconductor device 10 is disposed within the socket 20 such that the contacts 16 on the underside of the substrate 12 of the lidless semiconductor device 10 contact the corresponding conductive members 24 within the socket 20. The pressure plate 60, having the bushings 66 mounted in the pressure plate 60 through-holes 64, is disposed over the lidless semiconductor device 10 such that the upper end of each standoff 84 extends into the through-bore 72 of the corresponding bushing 66 and the semiconductor die 14 projects into the generally rectangular opening 62 in the pressure plate 60. The heat sink 40 is positioned above the pressure plate 60 such that the openings 42 in the heat sink 40 corners coaxially align with the threaded bores 86 of the standoffs 84. A generally rectangular pedestal 56 that extends downwardly from the underside of the heat sink 40 abuts the top surface of the semiconductor die 14.

The first springs 46 have an inside diameter that permits the first springs 46 to be disposed around the respective cap screws 44. The upper end of each of the first springs 46 abuts the first shoulder 50 of the respective cap screw 44. The lower end of the first springs is disposed over the upper end 70 of the bushings 66. The through-holes 42 within the corners of the heat sink 40 have a diameter greater than the outside diameter of the first springs 46 so as to permit the first springs 46 to pass through the through-holes 42. Thus, upon tightening of the cap screws 44, the first springs 46 apply a downward pressure on the substrate 12 via the pressure plate 60 and the bushings 66 mounted therein. The pressure imparted on the substrate 12 by the pressure plate 60 causes the conductive members 24 to electrically couple the printed circuit board 30 contacts 32 to the contacts 16 disposed on the underside of the semiconductor device 10 substrate 12.

The second springs 48 have an inner diameter that is greater than the outer diameter of the first springs 46. This allows the second springs 48 to be disposed around the cap screws 44 and over the first springs 46. When the lidless semiconductor device is mounted as depicted in FIG. 4, the upper ends of the second springs 48 abut the second shoulder 52 of the cap screws 44 and the lower ends of the second springs 48 abut the surface of the heat sink 40 surrounding the through-holes 42. Thus, the tightening of the cap screws 44 causes the second springs 48 to apply a downward force on the heat sink 40 and urges the heat sink pedestal 56 into thermally conductive contact with the top surface of the semiconductor die 14.

The stiffness of the second springs 48 may be less than the stiffness of the first springs 46 so as to assure that the pressure applied by the pedestal 56 to the top surface of the semiconductor die 14 is not so great as to cause damage to the semiconductor die 14.

It should be appreciated that modification to and variations of the above-described assembly for mounting a lidless semiconductor die may be made without departing from the inventive concepts described herein. Accordingly, the invention should not be viewed as limited except as by the scope and spirit of the appended claims.

What is claimed is:

1. A mounting assembly for a lidless semiconductor device including a substrate having a semiconductor die mounted thereon and conductive contacts on an underside of said substrate, said assembly comprising:

a printed circuit board having a plurality of conductive contacts arranged in a predetermined grid array pattern;

a socket for said lidless semiconductor device, said socket having a plurality of conductive members disposed within said socket in said predetermined grid array pattern, said socket disposed on said printed circuit board in a mounting position such that one end of said conductive members makes conductive contact with corresponding ones of said conductive contacts on said printed circuit board, and another end of said conductive members makes conductive contact with said conductive contacts on said substrate when said lidless semiconductor device is disposed within said socket;

a set of first spring restraints and a set of second spring restraints;

a set of first springs having one end abutting corresponding ones of said first spring restraints, and another end of said first springs being operative to impart a downward pressure to said substrate of said lidless semiconductor device without imparting any pressure to said semiconductor die;

a heat sink mounted with a first heat sink surface adjacent a top surface of said semiconductor die; and a set of second springs having one end abutting corresponding ones of said second spring restraints, and another end of said second springs being operative to apply a downward force on said heat sink to urge said first heat sink surface into thermally conductive abutting relation with said top surface of said semiconductor die.

2. The mounting assembly of claim 1 wherein said first and second spring restraints comprise cap screws and said first spring restraints correspond to a first shoulder on said cap screws and said second spring restraints correspond to a second shoulder on said cap screws.

3. The mounting assembly of claim 1 wherein said assembly further includes a pressure plate disposed between said heat sink and said substrate of said lidless semiconductor device when said lidless semiconductor device is disposed within said socket in assembled relation and said first springs are operative to impart a downward pressure on said pressure plate which imparts said downward pressure on said substrate.

4. The mounting assembly of claim 3 wherein said pressure plate has an opening within the center portion of the pressure plate sized to receive said semiconductor die.

5. The mounting assembly of claim 1 wherein said heat sink includes a downwardly extending pedestal having a bottom surface and said pedestal bottom surface corresponds to said heat sink first surface.

6. The mounting assembly of claim 5 wherein said pressure plate opening is sized to permit said pedestal to extend into said opening and to abut said top surface of said semiconductor die.

7. The mounting assembly of claim 2 wherein said assembly further includes a bolster plate disposed below said printed circuit board, a plurality of standoffs mounted within said bolster plate and extending through corresponding openings provided within said printed circuit board, said cap screws extending through openings provided in a lower surface of said heat sink, through openings provided in said pressure plate and through said first and second springs, said standoffs each having a threaded bore at an upper end thereof, and said cap screws each having a threaded screw portion at a lower end thereof that is screwed into the threaded bore of a corresponding one of said standoffs to retain said heat sink, said pressure plate, said lidless semiconductor device, said socket, said printed circuit board and said bolster plate in assembled relation.

8. A method for mounting a lidless semiconductor device having a substrate and a-semiconductor die mounted thereon and wherein said substrate includes a plurality of conductive contacts arranged in a predetermined grid array on a lower surface of said substrate, said method comprising:

mounting a semiconductor device socket to a printed circuit board having a plurality-of conductive contacts arranged in said predetermined grid array, wherein said socket includes a plurality of conductive members arranged in said predetermined grid array for conductively coupling said printed circuit contacts to said substrate contacts;

locating a lidless semiconductor device within said socket;

locating a pressure plate over said lidless semiconductor device such that the periphery of said plate abuts said substrate and said semiconductor die extends at least partially through an opening within said pressure plate;

applying a first downward pressure on said pressure plate via a set of first springs to conductively couple said printed circuit board contacts to said substrate contacts via said conductive members;

locating a heat sink over said lidless semiconductor device such that a lower heat sink surface abuts said semiconductor die; and applying a second downward pressure on said heat sink via a set of second springs to urge said heat sink into thermally conductive contact with said semiconductor die.

9. A mounting assembly for a lidless semiconductor device including a substrate having a semiconductor die mounted thereon and conductive contacts on an underside of said substrate, said assembly comprising:

a circuit board and a plurality of conductive contacts on said circuit board;

a socket for said lidless semiconductor device, said socket mounted on said circuit board and having a plurality of conductive members arranged to electrically connect said conductive contacts on said substrate with said conductive contacts on said circuit board when said lidless semiconductor device is mounted on said socket;

first springs operatively connected to impart a downward pressure to said substrate without imparting any pressure to said semiconductor die;

a heat sink mounted with a first heat sink surface adjacent a top surface of said semiconductor die; and second springs operatively connected to apply a downward force on said heat sink to urge said first heat sink surface into thermally conductive abutting relation with said top surface of said semiconductor die.

* * * * *